United States Patent [19]

Gehlot

[11] Patent Number: 5,737,366
[45] Date of Patent: Apr. 7, 1998

[54] METHOD AND APPARATUS FOR RECEIVING LINE ENCODED BURSTS OF INFORMATION

[75] Inventor: Narayan Lal Gehlot, Middlesex, N.J.

[73] Assignee: Lucent Technologies Inc., Murray Hill, N.J.

[21] Appl. No.: 580,953

[22] Filed: Dec. 29, 1995

[51] Int. Cl.$^6$ .................... H03K 5/26; H03K 9/08
[52] U.S. Cl. .................... 375/238; 375/287; 375/289; 359/186
[58] Field of Search .................... 375/238, 257, 375/286–289, 316–317, 361; 329/312–313; 359/140, 184–186, 189

[56] References Cited

U.S. PATENT DOCUMENTS

| | | | |
|---|---|---|---|
| 4,006,304 | 2/1977 | Sell | 375/289 X |
| 4,347,617 | 8/1982 | Murano et al. | 375/238 |
| 4,475,212 | 10/1984 | McLean et al. | 375/286 |
| 4,571,514 | 2/1986 | Nelson et al. | 375/238 X |
| 4,665,531 | 5/1987 | Aly | 375/286 |
| 4,713,841 | 12/1987 | Porter et al. | 359/186 X |
| 4,831,662 | 5/1989 | Kuhn | 359/185 X |

OTHER PUBLICATIONS

"Electronics For High Speed, Burst Mode Optical Communications", R.G. Schwartz et al., International Journal of High Speed Electronics, vol. 1, Nos. 3 & 4, (1990), pp. 223–243.

"Burst–Mode Compatible Optical Receiver With A Large Dynamic Range", Yusuke Ota et al., Journal of Lightwave Technology, vol. 8, No. 12, Dec. 1990.

"DC–1Gb/s Burst–Mode Compatible Receiver For Optical Bus Applications", Yusuke Ota et al., Journal of Lightwave Technology, vol. 10, No. 2, Feb. 1992.

"An Instantaneous Response CMOS Optical Receiver IC With Wide Dynamic Range And Extremely High Sensitivity Using Feed–Forward Auto–Bias Adjustment", Makata Nakamura et al., IEEE Journal of Solid–State Circuits, vol. 30, No. 9, Sep. 1995.

"Receiver For Optical Bus Applications", Journal of Lightwave Technology, vol. 10, No. 2, 1992, p. 8.

"Motorola Optoelectronic Device Data", Motorola, Inc., 1983, pp. 5–8—8–20.

*Primary Examiner*—Young T. Tse

[57] ABSTRACT

An apparatus and method for receiving line encoded bursts of information removes unwanted background light and has a maximum inter-packet idle time of only one bit between bursts. The invention permits the use of AC coupling in a receiver and results in outputting data with constant pulse widths irrespective of optical signal power levels, etc. . . In one embodiment, a receiver has a wide dynamic range, is highly stable, may be used over all frequencies of interest without developing high speed electronics or optical components, and has no sensitivity penalty as compared to existing burst mode/packet mode receivers. Because the receiver completely removes common signals, base line wander problems are also removed. The inventive apparatus and method is superior to existing burst mode/packet mode receivers in the presence of unwanted background light and long runs of "1"s and "0"s.

42 Claims, 3 Drawing Sheets

METHOD AND APPARATUS FOR RECEIVING LINE ENCODED BURSTS OF INFORMATION

BACKGROUND OF THE INVENTION

1. Field of the Invention

The present invention relates to a method and apparatus for receiving line encoded bursts of information from multiple sources in packet-switched networks.

2. Background of Related Art

Existing optical networks are designed to transfer a large amount of data from point-to-point, i.e., from one or more sources to one receiver, using bi-directional multiplexing. For multi-point networks, a time division multiple access (TDMA) protocol is used. In such a multi-point network each "packet" of information is multiplexed in a time sequence on one fiber. A receiver at a central node must handle each packet as a burst of data coming from multiple sources where the packets have a wide range of input optical powers. Thus, such a receiver must have a wide dynamic range, high sensitivity and minimum inter packet idle time (IPIT) between any two adjacent packets having a high adjacent packet power ratio (APPR).

As the number of optical networks increases the "silence" period between any two bursts decreases, i.e., IPIT decreases. A receiver must be able to handle non-synchronous packets of high APPR, separated by a small amount of time. An ideal IPIT is one NRZ data bit in length (time) and is equal to $2 \times Tb$, where ($1/2 \times Tb$) is a data clock frequency.

A receiver used to receive such bursts of data (hereafter a "burst mode receiver") must be able to overcome a number of constraints. First, extracting timing information from incoming data is difficult to do. Next, tracking maximum and minimum voltage swings on a real-time basis in order to utilize decision thresholds is also difficult. No amount of circuit training can aid in decision extraction without real-time signal processing. These problems are challenging for existing burst mode/packet mode receivers.

Most of today's conventional receivers in optical networks use AC coupling. Coupling capacitors used in existing AC coupled systems are examples of real-time processors which establish ideal thresholds after a few pulses. However, coupling capacitors introduce base line "wander" problems due to long strings of "1"s or "0"s in nonreturn-to-zero (NRZ) data packets, typically used in optical networks.

In addition, in a burst mode, an AC coupled receiver must switch from one packet to another packet, each packet (potentially) differing in optical power. As a result, the AC coupling capacitor may miss a few bits of incoming NRZ data while attempting to adapt to each new level of each incoming packet.

In contrast, DC coupled receivers are not sensitive to line coding methods, e.g., NRZ coding, and, therefore, permit the use of different line coding schemes, e.g., NRZ, Manchester, RZ (return-to-zero). DC coupled receivers are ideal for burst mode or packet mode networks.

High speed, DC coupled receivers, while ideally suited for burst mode operations, are very difficult to implement. DC coupled receiver designs were first taken up by Swartz and Ota in 1987 and most recently by M. Nakamura et al. Swartz and Ota's work is based on peak detector methods, high speed electronics and multiple feedback techniques. M. Nakamura and others have described a multi-point, feed forward scheme without discussing the effect of unwanted background light (UBL) on circuit performance. Nakamura's technique also suffers from pulse width distortion. Yamada et al. have developed a receiver which appears to work only if a Manchester-type encoder is used at the transmitter. Therefore, Yamada's receiver cannot recover NRZ or differential NRZ data and appears to have a poor signal-to-noise ratio due to an increased bandwidth as a result of using Manchester lane encoding.

Typically, DC coupled receivers use feedback techniques, high speed circuitry and capacitors to dynamically establish reference thresholds. Inter-packet idle times are also high. For higher data rates, several bytes could be lost. Thus, network bandwidth is utilized inefficiently. In addition, rapid feedback may lead to instabilities. Several off-chip capacitors are required. The size of these capacitors and the amount of charge they must hold to operate successfully place limitations on the speed in which such DC coupled receivers can operate. Moreover, frequency dependent, capacitor based feedback results in a loss of sensitivity between a random bit sequence and a known fixed packet transmission.

Still another existing burst mode/packet mode receiver uses a conventional automatic gain control (AGC) technique. AGC techniques are well known from radio and radar developments where a portion of the output is taken to monitor the input. However, these AGC techniques take several microseconds to track and establish required conditions, e.g., voltages, and therefore, are not suitable for higher data rates used in optical networks.

SUMMARY OF THE INVENTION

It is an object of the present invention to provide an apparatus for receiving at least a single input, data bit stream of line encoded bursts of information where each data bit of the data bit stream has an original pulse width. The apparatus comprising a splitter for at least splitting the input, data bit stream into first and second data bit streams and a delay device for delaying information in the second data bit stream relative to information in the first data bit stream. The apparatus further comprising difference circuitry for generating a bipolar, difference data bit stream from the information in the delayed, second data bit stream and the information in the first data bit stream and ideal threshold circuitry for outputting a first bit when a voltage level of a first signal in the bipolar, difference data bit stream exceeds a threshold voltage and outputting a second bit when a voltage level of a second signal in the bipolar, difference data bit stream exceeds the threshold voltage. The apparatus still further comprises pulse regenerating circuitry for regenerating each data bit in the line encoded data bit stream using the first and second bits, each regenerated data bit having a regenerated pulse width equal to said original pulse width.

BRIEF DESCRIPTION OF THE DRAWINGS

The invention, together with its various features and advantages can be readily understood from the following more detailed description taken in conjunction with the accompanying drawings in which.

DETAILED DESCRIPTION OF PREFERRED EMBODIMENTS

Figure 1A:
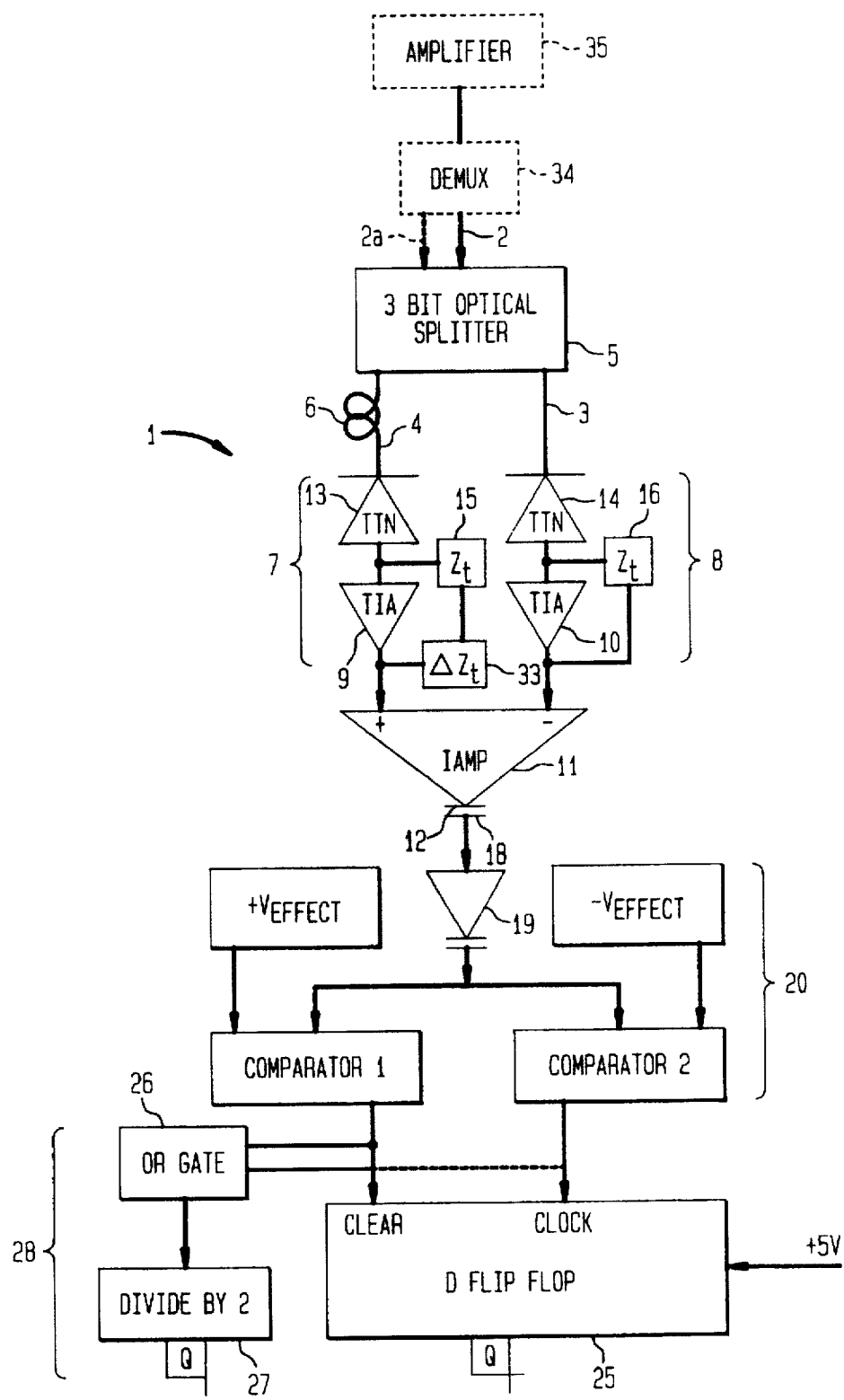
FIG. 1(A) depicts an apparatus for receiving line encoded bursts of information according to an illustrative embodiment of the invention.

An apparatus 1 for receiving line encoded bursts of information according to an illustrative embodiment of the invention is shown in FIG. 1(A). This apparatus creates a new signal 12 that has a bipolar, return-to-zero (BRZ) format from at least a single input data bit stream 2 of a line encoded burst of information, such as a unipolar/unsymmetric/unbalanced, NRZ optical signal. Though an NRZ input will be used to illustrate embodiments of the invention, it should be noted that any appropriate line encoded format such as NRZ, Differential NRZ, Manchester or RZ may be used as the input 2. A BRZ signal has no signal power at DC or zero Mz and negligible power at low frequencies. This apparatus 1 completely eliminates UBL. Two examples of UBL are DC optical signals present in the network due to a large number of lasers operating using a prebias for higher speed, and DC optical power levels from optical cross-talk. The apparatus 1 also eliminates base line "wander" and stability problems inherent in existing AC or DC coupled receivers operating with ASK pulse trains having a NRZ format.

Referring again to FIG. 1(A), an optical signal or input data bit stream 2 of line encoded, NRZ bursts of information is split into first 3 and second 4 bit streams by a splitter 5. Each bit in the bit stream 2 has an original pulse width. The second bit stream or path 4 is delayed with respect to the first bit stream 3 by a delay device 6. In one embodiment the delay device is a length of optical fiber. This delay may be a finite, non-zero delay. In another embodiment, the delay may be anywhere from at least one-half a line encoded clock cycle to one full clock cycle. In one illustrative embodiment the optical delay is one half the NRZ pulse width ($T_b$) or clock cycle. In another embodiment the delay may equal a finite, non-zero delay which is less than one-half clock cycle. Continuing, two optical-to-electrical (O/E) demodulators 7, 8 comprising PIN diode circuits 13, 14 and transimpedance amplifiers (TIAs) 9, 10 are employed to convert optical signals to electrical signals. These two O/Es may be referred to together as an optical-to-electrical converting device.

Difference or subtraction circuitry 11 generates a bipolar, difference (or differential, bipolar (DBRZ)) data bit stream 12 by subtracting information in the delayed, second data bit stream 4 from information in the first data bit stream 3.

It should be noted that the delay device 6 determines the location of the second data bit stream 4. That is, the delay device 6 and, therefore, the second data bit stream may be the left or right bit stream (looking at FIG. 1(a)).

The difference or substraction circuitry 11 may comprise an amplifier or any other appropriate device which generates or identifies the difference between the first and second data bit streams 3, 4.

In the above embodiment of the invention an optical delay and splitter is utilized. The invention, however, is not limited to using such optical devices.

Figure 1B:
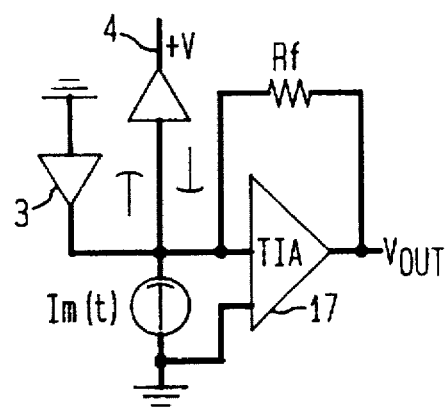
FIG. 1(B) depicts difference circuitry according to another illustrative embodiment of the invention.
Figure 1C:
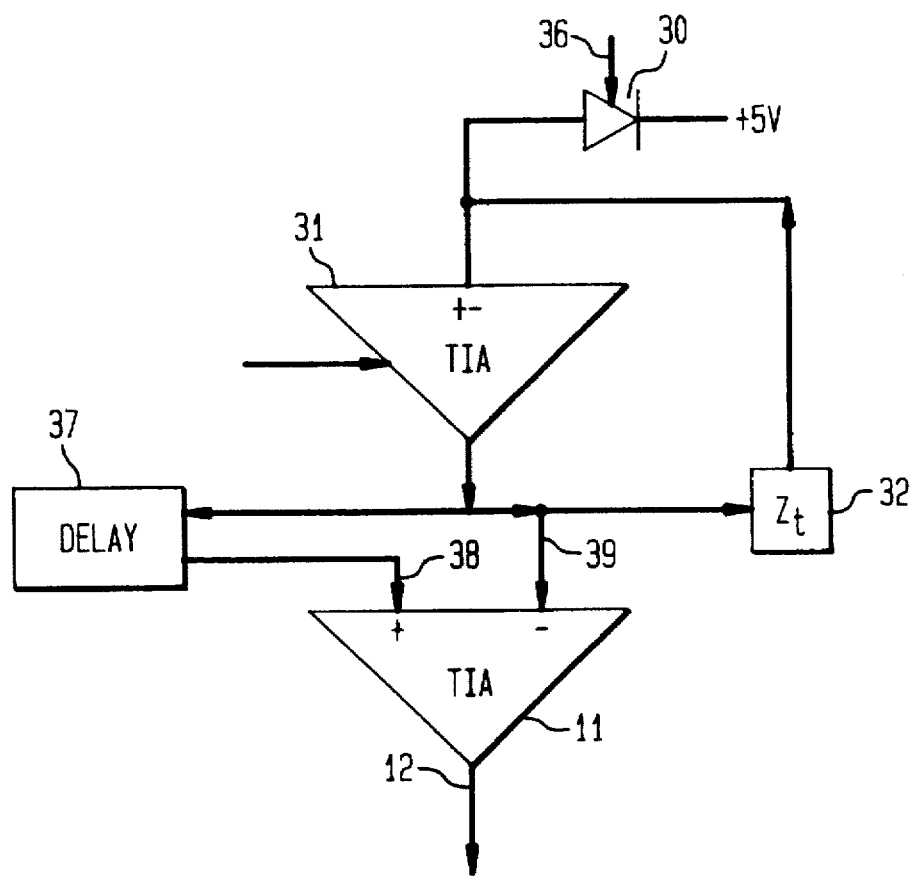
FIG. 1(C) depicts splitting and delay circuitry according to another illustrative embodiment of the invention.

An embodiment of the invention using an electrical delay and splitting device 37 is shown in FIG. 1(C). In such an embodiment only one PIN diode 30 and TIA amplifier 31 is used with a feedback device 32 to delay and split an input bit stream 36 into two bit streams 38 and 39.

Referring back to FIG. 1(A). In a DBRZ data bit stream a zero volt pulse indicates that a data bit is the same (either a repeating "1" or "0") as a previous bit, while an alternating, non-zero pulse indicates that a data bit has changed from a previous one. Non-zero pulses after subtraction have either a RZ pulse format or a bipolar balanced/symmetric full width NRZ pulse. Any unwanted signal due to UBL, outside the signal bandwidth, is a common mode signal at the output of the PIN diodes 13, 14 and TIAs 9, 10 and is eliminated by the subtraction process. The optical-to-electrical converter also comprises at least one feed back device or differential feedback device ($\Delta Z_t$) 33 in the second data bit stream 4, to minimize electro-optical imbalances generated during the optical to electrical conversion process. Two feedback resisters 15, 16 also restore signal voltage to the first and second data bit streams which occur when the input data bit stream 2 is split, by doubling the resistance values of the feedback devices 15, 16 without affecting the dynamic range of the receiver compared to existing receivers.

Another embodiment of the invention equivalent to the delay and subtraction circuitry of FIG. 1(A) is shown in FIG. 1(B). An advantage of this embodiment is that it requires only one TIA 17 and has a smaller overall optical power penalty of approximately 1.62 dB due to the fact that thermal noise does not double as in the case of the embodiment in FIG. 1(A) using two TIAs 9, 10. A disadvantage of this embodiment, however, is that optical imbalances between bit streams cannot be practically compensated.

The power spectral density (PSD) of the bipolar, difference data bit stream 12 after subtraction is ideal for AC coupling and large amplification. Unwanted, low frequency signal components, such as DC voltages caused by non-linearities, imbalances and non-tracking of electrical and optical components in the first and second data bit streams, are removed by an AC coupling capacitor 18 before amplification by amplifier 19. A large signal gain is possible because DC voltage errors and temperature drift effects, which lead to the saturation of amplifier gain stages, are eliminated. Moreover, the large gain is also due to the elimination of base line wander. These eliminated effects are inherent in all existing AC and DC coupled receivers.

Figure 2:
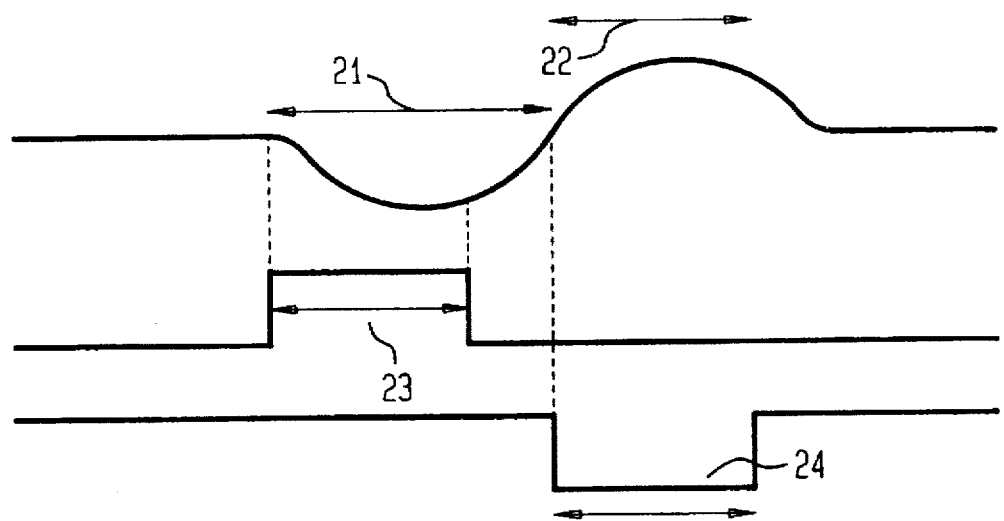
FIG. 2 depicts signals and bits generated by an illustrative embodiment of the invention.

Once the bipolar, difference data bit stream 12 is output from the amplifier 19 it is input into ideal threshold circuitry 20. In one illustrative embodiment of the invention, a decision mechanism comprises ideal threshold circuitry 20 which uses a first and second threshold voltage e.g., $\pm V_d$, or $\pm V_{offset}$. After filtering, a "decision" (or output) can be selected based on samples or threshold level crossings. Using the later method, which does not require a sampling clock, a first signal 21 (see FIG. 2) of the bipolar, difference data bit stream 12 is detected and generates a first bit 23, when the first threshold (e.g., $\pm V_d$) is crossed or exceeded by a rising edge from zero volts to more than $+V_d$. A pulse train of inverted first bits is then output from the ideal threshold circuitry 20 which may comprise one or more comparators or amplifier gain stages, to pulse regenerating circuitry 25 which may comprise a D flip-flop (D-FF). The circuitry 25 changes its output from a logical "0" to "1" at an edge of the first bit 23. The output remains at "1" until there is a crossing of the second threshold, e.g. $-V_d$, by a second signal 22 in the bipolar, difference data bit stream. A bit 24 generated by such a crossing will be referred to as a second bit. An edge of the second bit 24 is used to change the output of the circuitry 25 from a logical "1" to "0" by using the second bit as a "clear" input to the D-FF.

In another embodiment of the invention, a single threshold may be used to create the first 23 and second 24 bits. To use a single threshold an ideal threshold circuit comprises two circuits, with their threshold tied together. The bit stream 12 is input into one circuit while an inverted version of the bit stream 12 is input into the second circuit. When a voltage of the first signal 21 exceeds the single threshold voltage in the first circuit, the first bit 23 is generated. Likewise, when the second, now inverted signal 22 exceeds the same single threshold in the second circuit, second bit 24 is generated. It should be noted that either the first or second signals 21, 22 may be inverted. Both the first and second circuits may be referred to as ideal threshold circuitry.

Alternatively, the first and second bits can be first combined using another pulse regenerating circuit 28 comprising an OR gate 26. If C1ORC2 is input to an edge of a JK-FF divide by two counter 27 the original NRZ data can be recovered.

In still another embodiment, a window detector (not shown) comprising two amplifiers and symmetric reference voltages of ±Vd will give C1ORC2 directly using ±Vd as an inherent hysteresis voltage resulting in a 6 dB (electrical) advantage.

If amplifier gain stages are used as apart of the ideal threshold circuitry 20 they may comprise cascaded amplifier gain stages.

Importantly, the output of the pulse regenerating circuitry 25 or 28 produces NRZ data bits which have a regenerated pulse width equal to the original pulse width of the NRZ pulse input to the splitter 5.

Figure 3:
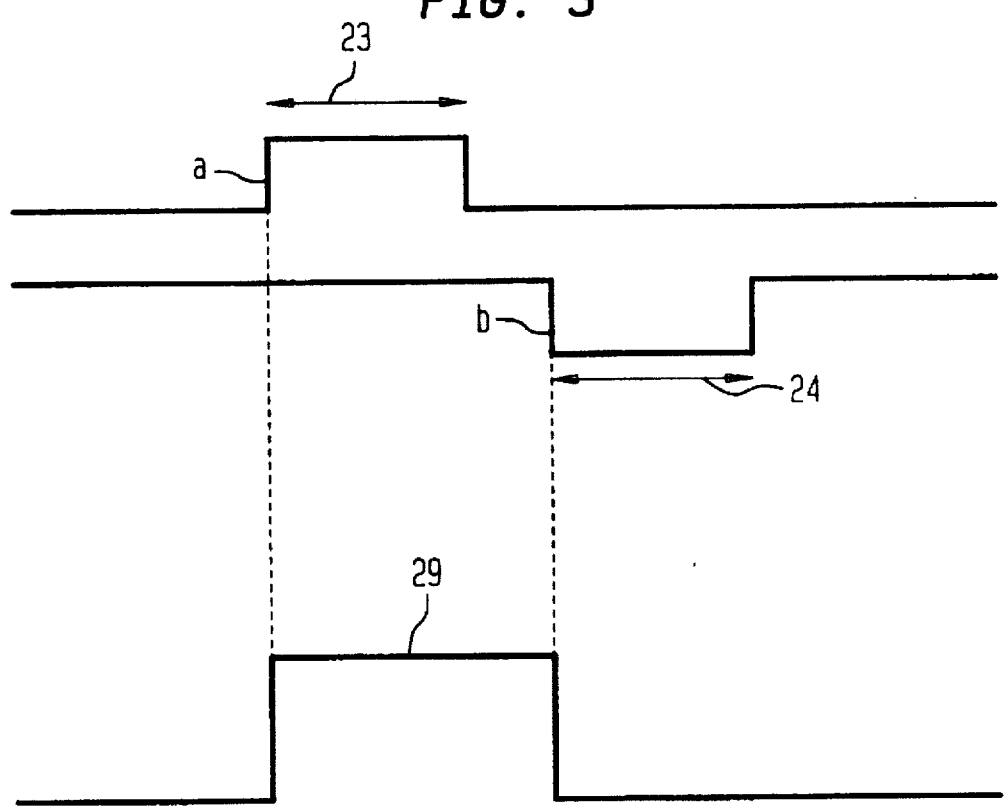
FIG. 3 depicts a regenerated line encoded bit according to an illustrative embodiment of the invention.

FIG. 3 further illustrates how a NRZ data bit is regenerated. As shown, an edge, "a", of the first bit 23, in this case a leading edge although a trailing edge would work as well, marks the beginning of a regenerated NRZ data bit 29. Likewise, an edge "b" (again a leading edge or trailing edge) of the second bit 24 marks the end of the NRZ data bit 29. The time between the detection of edge "a" and edge "b" is a regenerated pulse width which is equal to the original pulse width of the same NRZ data bit originally input to splitter 5.

As stated before edges "a" and "b" may be leading or trailing edges, however, both edges must be either both leading or both trailing edges, i.e., "a" cannot be a leading edge, and "b" a trailing edge.

A receiver according to the above embodiment of the invention provides advantages and trade-offs over existing DC coupled receivers.

One trade-off is in input signal power. The splitter 5 has reduced the optical input signal power of the input data bit stream 2 to each of the PIN diodes 13, 14 by approximately 3 dB.

The upper limit of a receiver's dynamic range is usually limited by the saturation of a TIA, which restricts the size of the feedback resistance, $R_f$. In an embodiment of the present invention, because the power is split, the upper end of the inventive receiver's dynamic range is increased by 3 dB (optical). Because the maximum optical power is limited to $P_{in}/2$ for each bit stream 3, 4 Rf can be increased by a factor of two without saturating the individual TIAs 9, 10. Feedback resistors 15, 16 used with each TIA can be (2* $R_f$) without effecting overall dynamic range of the inventive receiving apparatus.

Each of the data bit streams or channels 3, 4 generates uncorrelated independent Gaussian thermal noise (assuming thermal noise dominates over shot noise). During subtraction, thermal noise doubles for the apparatus shown in FIG. 1(a) resulting in an additional optical power penalty of 1.5 dB.

However, for the apparatus shown in FIG. 1(b) there is no optical power penalty due to subtraction assuming no optical imbalances. In any event, the worst case optical imbalance is less than 0.8 dB (optical) for a single wavelength splitter over a temperature range of −40° C. to +85° C.

As stated before the inventive receiver eliminates UBL, including DC light.

When two thresholds are used in the ideal threshold circuitry 20 there is no need to use additional hysteresis thresholds or logic zero offset voltages as suggested by Ota and Swartz. This amounts to a benefit of 6 dB (electrical) or 3 dB (optical) as compared to existing AC or DC coupled burst mode receivers.

Using an AC coupled, bipolar, difference data bit stream there is no penalty due to temperature drifts, no voltage and current error build-ups, and no base line wander. Additional sensitivity gains are expected using data in an RZ format, due to decreased intersymbol interference.

Finally, rising and falling edges of NRZ pulses used in existing DC and AC coupled receivers introduce pulse width distortion due to changes in input optical power levels and variations in the electrical power supply being used. However, because of the use of symmetric first and second bits 23, 24 the pulse width of an original NRZ data bit remains constant irrespective of electrical power supply fluctuations or optical signal power input levels, further increasing the inventive receiver's sensitivity.

The inventive apparatus 1 also may be used in a wavelength-division-multiplexing (WDM) scheme. Using an optional optical amplifier 35 and optical demultiplexer 34, a single bit stream 2A is input into the apparatus 1. It should be understood that the bit stream 2A is just one of many output from the demultiplexer 34. This bit stream operates at a wavelength which is distinct from the wavelengths which correspond to the other bit streams output from the demultiplexer 34.

Each bit stream from the demultiplexer 34 may be input into a separate inventive apparatus 1. Advantageously, the same finite, non-zero delay can be set in each delay device 6 of each apparatus 1 regardless of the number of bit streams 2A.

Because the invention provides for wide dynamic range and generates a difference signal, problems typically associated with the demultiplexer 34, such as crosstalk and the amplifier 35, such as gain and power fluctuations, are avoided.

The inventive apparatus 1 also allows simple error correction techniques to be used. A single error may result in error propagation. Such errors may be corrected for by introducing a differential decoder at a transmitter before a laser diode and a differential encoder at the inventive apparatus 2 after the D-FF. These additional coders and decoders are easily implemented with XOR gates. This eliminates error propagation but may still result in two errors, e.g., a $1*10^{-9}$ bit error rate (BER) will become $2*10^{-9}$ BER (optical penalty of 0.1 dB or less).

It is to be understood that the above-described embodiments are merely illustrative of the many possible embodiments which can be devised to represent the application of the principles of the invention. Numerous and varied other arrangements can be devised in accordance with these principles by those skilled in the art without departing from the spirit and scope of the invention.

Finally, though some of the embodiments discussed above focused on optical packet networks, the inventive apparatus and method is applicable to other packet switched networks as well.

What is claimed is:

1. An apparatus for receiving at least a single input, data bit stream of line encoded bursts of information, each data bit of the data bit stream having an original pulse width, comprising:

a splitter for at least splitting the input, data bit stream into a first data bit stream and a second data bit stream;

a delay device for delaying information in the second data bit stream relative to information in the first data bit stream;

difference circuitry for generating a bipolar, difference data bit stream from the information in the delayed, second data bit stream and the information in the first data bit stream;

ideal threshold circuitry for outputting a first bit when a voltage level of a first signal in the bipolar, difference data bit stream exceeds a threshold voltage and outputting a second bit when a voltage level of a second signal in the bipolar, difference data bit stream exceeds the threshold voltage; and pulse regenerating circuitry for regenerating each data bit in the line encoded data bit stream using the first and second bits, each regenerated data bit having a regenerated pulse width equal to said original pulse width.

2. The apparatus as in claim 1, wherein said pulse regenerating circuitry comprises detection circuitry for detecting the first and second bits and for determining the regenerated pulse width, the regenerated pulse width equaling a time between the detection of an edge of the first bit and an edge of the second bit by said detection circuitry.

3. The apparatus as in claim 2, wherein the edge of the first bit is a leading edge and the edge of the second bit is a leading edge.

4. The apparatus as in claim 2, where in the edge of the first bit is a trailing edge and the edge of the second bit is a trailing edge.

5. The apparatus as in claim 1, wherein the threshold voltage comprises a first and a second threshold voltage, said ideal threshold circuitry outputting the first bit when the voltage level of the first signal in the bipolar, difference data bit stream exceeds the first threshold voltage and outputting the second bit when the voltage level of the second signal in the bipolar, difference data bit stream exceeds the second threshold voltage.

6. The apparatus as in claim 1, wherein the at least single input data bit stream is an optical input, said apparatus further comprising an optical-to-electrical converting device for converting the information in the first and second data bit streams from optical to electrical signals, said converting device comprising a feedback device for minimizing optical-electrical imbalances generated during said conversion.

7. The apparatus as in claim 1, wherein the splitter is an optical splitter.

8. The apparatus as in claim 1, wherein the delay device is an optical delay device.

9. The apparatus as in claim 8, wherein the optical delay device comprises optical fiber.

10. The apparatus as in claim 1 wherein the splitter is an electrical splitter.

11. The apparatus as in claim 1 wherein the delay device is an electrical delay device.

12. The apparatus as in claim 1, wherein the delay device delays the information in the second data bit stream by an amount equal to at least one-half clock cycle.

13. The apparatus as in claim 1, wherein the delay device delays the information in the second data bit stream by a finite, non-zero delay.

14. The apparatus as in claim 1, wherein the ideal threshold circuitry comprises amplifier gain stages.

15. The apparatus as in claim 14 wherein the amplifier gain stages comprise cascaded amplifier gain stages.

16. The apparatus as in claim 1, further comprising at least a coupling capacitor connected to said bipolar, difference data bit stream.

17. The apparatus as in claim 1, wherein the line encoded bursts are non-return-to-zero bursts of information.

18. The apparatus as in claim 1, wherein the line encoded bursts are differential, non-return-to-zero bursts of information.

19. The apparatus as in claim 1, wherein the line encoded bursts are Manchester coded bursts of information.

20. The apparatus as in claim 1, wherein the line encoded bursts are return-to-zero bursts of information.

21. The apparatus as in claim, 1, wherein the difference circuitry comprises subtraction circuitry for subtracting the information in the delayed, second data bit stream from the information in the first data bit stream.

22. A method for receiving at least a single input, data bit stream of line encoded bursts of information, each data bit of the data bit stream having an original pulse width, comprising:

splitting the input data bit stream into a first data bit stream and a second data bit stream;

delaying information in the second data bit stream relative to information in the first data bit stream;

differencing the information in the delayed second data bit stream and the information in the first data bit stream to generate a bipolar, difference data bit stream;

outputting a first bit when a voltage level of a first signal in the bipolar, difference data bit stream exceeds a threshold voltage and outputting a second bit when the voltage level of a second signal in the bipolar, difference data bit stream exceeds the threshold voltage; and regenerating each data bit in the line encoded data bit stream using the first and second bits, each regenerated data bit having a regenerated pulse width equal to said original pulse width.

23. The method as in claim 22, wherein said regenerating comprises:

detecting the first and second bits;

determining the regenerated pulse width, the regenerated pulse width equaling a time between detection of an edge of the first bit and an edge of the second bit.

24. The method as in claim 23, wherein the edge of the first bit is a leading edge and the edge of the second bit is a leading edge.

25. The method as in claim 23, wherein the edge of the first bit is a trailing edge and the edge of the second bit is a trailing edge.

26. The method as in claim 22, wherein the threshold voltage comprises a first and a second threshold voltage, said outputting comprising outputting the first bit when the voltage level of the first signal in the bipolar, difference data bit exceeds the first threshold voltage and outputting the second bit when the voltage level of the second signal in the bipolar, difference data bit exceeds the second threshold voltage.

27. The method as in claim 22, wherein the at least single input, data bit stream is an optical input, said method further comprising converting the information in the first and second data bit streams from optical to electrical signals, said converting comprising minimizing optical-electrical imbalances generated during said conversion.

28. The method as in claim 22, wherein said splitting comprises optically splitting the input data bit stream into the first data bit stream and the second data bit stream.

29. The method as in claim 22, wherein said delaying comprises optically delaying information in the second data bit stream relative to information in the first data bit stream.

30. The method as in claim 29, wherein said delaying comprises the use of optical fiber.

31. The method as in claim 22 wherein said splitting comprises electrically splitting the input data bit stream into the first data bit stream and the second data bit stream.

32. The method as in claim 22, wherein said delaying comprises electrically delaying information in the second data bit stream relative to information in the first data bit stream.

33. The method as in claim 22., wherein said delaying comprises delaying the information in the second data bit stream by at least one-half clock cycle.

34. The method as in claim 22, wherein said delaying comprises delaying the information in the second data bit stream by a finite, non-zero delay.

35. The method as in claim 22, wherein said outputting comprises the use of amplifier gain stages.

36. The method as in claim 35 wherein the amplifier gain stages comprise cascaded amplifier gain stages.

37. The method as in claim 22, further comprising at least capacitively coupling the bipolar, difference data bit stream.

38. The method as in claim 22, wherein the line encoded bursts are non-return-to-zero bursts of information.

39. The method as in claim 22, wherein the line encoded bursts are differential, non-return-to-zero bursts of information.

40. The method as in claim 22, wherein the line encoded bursts are Manchester coded bursts of information.

41. The method as in claim 22, are return-to-zero bursts of information.

42. The method as in claim 22, wherein said differencing comprises subtracting the information in the delayed, second data bit stream from the information in the first data bit stream.

* * * * *